(12) United States Patent
Wu

(10) Patent No.: US 12,374,671 B2
(45) Date of Patent: *Jul. 29, 2025

(54) DISPLAY PANEL HAVING OPENINGS TO BE ATTACHED TO A CURVED SURFACE

(71) Applicant: InnoLux Corporation, Miao-Li County (TW)

(72) Inventor: Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 518 days.

This patent is subject to a terminal disclaimer.

(21) Appl. No.: 17/848,423

(22) Filed: Jun. 24, 2022

(65) Prior Publication Data

US 2022/0320062 A1    Oct. 6, 2022

Related U.S. Application Data

(63) Continuation-in-part of application No. 17/471,179, filed on Sep. 10, 2021, now Pat. No. 11,985,852.

(30) Foreign Application Priority Data

Oct. 28, 2020 (CN) .......................... 202011173191.3

(51) Int. Cl.
*H01L 25/16* (2023.01)
*H10D 86/40* (2025.01)
*H10D 86/60* (2025.01)
*H10K 59/124* (2023.01)
*H10K 77/10* (2023.01)
*H10K 102/00* (2023.01)

(52) U.S. Cl.
CPC ......... *H01L 25/167* (2013.01); *H10D 86/411* (2025.01); *H10D 86/60* (2025.01); *H10K 59/124* (2023.02); *H10K 77/111* (2023.02); *H10K 2102/311* (2023.02)

(58) Field of Classification Search
CPC . H01L 25/167; H01L 25/0753; H10D 86/411; H10D 86/60; H10K 59/124; H10K 77/111; H10K 2102/311; H10K 59/131
See application file for complete search history.

(56) References Cited

U.S. PATENT DOCUMENTS

| 11,985,852 | B2 * | 5/2024 | Wu | H10K 59/121 |
| 2021/0376006 | A1 * | 12/2021 | Won | H10K 59/121 |
| 2022/0320250 | A1 * | 10/2022 | Kim | H10K 50/8445 |
| 2024/0341143 | A1 * | 10/2024 | Lee | H10K 50/813 |

* cited by examiner

*Primary Examiner* — J. E. Schoenholtz
(74) *Attorney, Agent, or Firm* — Winston Hsu

(57) ABSTRACT

The present disclosure provides a display panel, the display panel includes a flexible substrate having a first edge and a curve region, the curve region has a Gauss curvature K1 not equal to zero, a plurality of thin film transistors disposed on the flexible substrate, and a plurality of light emitting units disposed on the flexible substrate and driven by the thin film transistors, the flexible substrate has a first opening in the curve region and a second edge adjacent to the first opening.

9 Claims, 15 Drawing Sheets

DISPLAY PANEL HAVING OPENINGS TO BE ATTACHED TO A CURVED SURFACE

CROSS REFERENCE TO RELATED APPLICATIONS

This application is a continuation-in-part of U.S. application Ser. No. 17/471,179, filed on Sep. 10, 2021. The content of the application is incorporated herein by reference.

BACKGROUND OF THE DISCLOSURE

1. Field of the Disclosure

The present disclosure relates to a display panel, in particular to a flexible display panel having an opening to be attached to a curved surface.

2. Description of the Prior Art

In recent years, in order to apply display panels to various applications, such as smart phones, tablet computers, notebook computers and E-readers, and to wearable devices, such as smart watches, display panels have become more and more important, and manufacturers continue to develop new display panels.

SUMMARY OF THE DISCLOSURE

The present disclosure provides a display panel, the display panel comprises a flexible substrate having a first edge and a curve region, the curve region has a Gauss curvature K1 not equal to zero, a plurality of thin film transistors disposed on the flexible substrate, and a plurality of light emitting units disposed on the flexible substrate and driven by the thin film transistors, the flexible substrate has a first opening in the curve region and a second edge adjacent to the first opening.

The present disclosure provides a display panel, which can be attached to a target. The display panel has a partial region corresponding to a curved surface with Gauss curvature not equal to zero, and an opening is formed in the partial region of the display panel. After the opening is formed, it is helpful to improve the flexibility of the display panel, and when the display panel is covered on a curved surface with Gauss curvature not equal to zero, it is less likely to produce creases, thus improving the display effect of the display panel.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

The above objects and other objects of the present disclosure will undoubtedly become apparent to those skilled in the art after reading the following detailed description of embodiments illustrated in various drawings.

DETAILED DESCRIPTION

Figure 1:
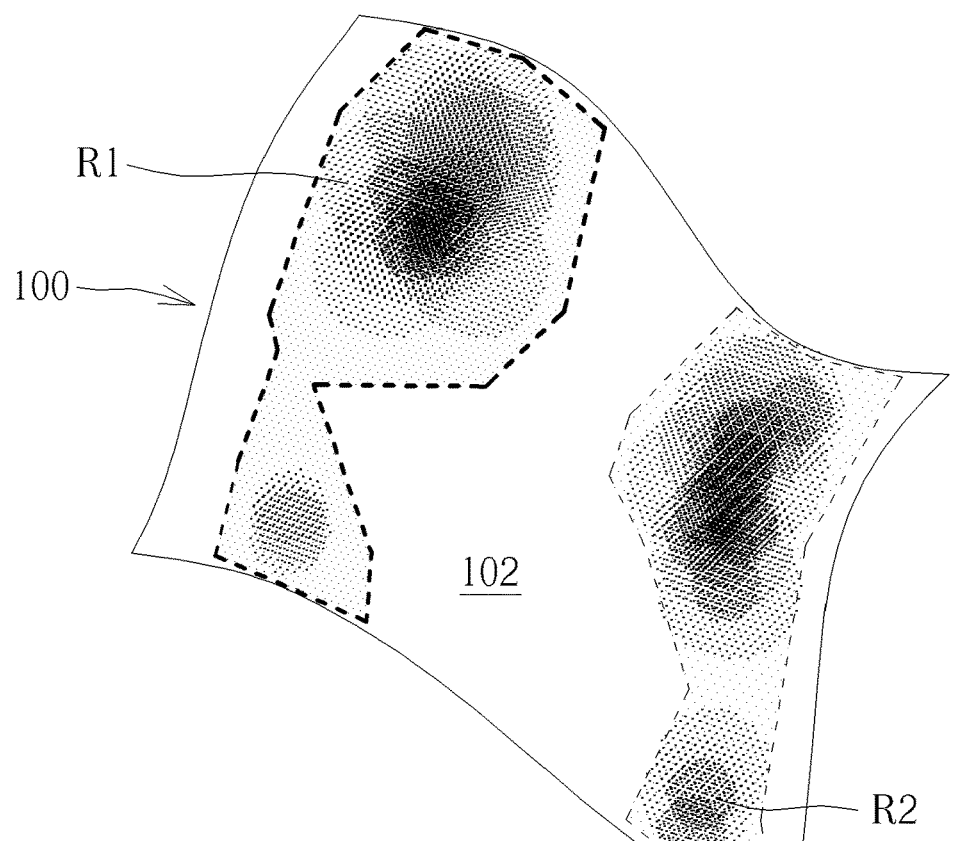
FIG. 1 is a schematic diagram of a region where a curved surface has different Gauss curvatures in this disclosure.

Those skilled in the art can understand the contents of the present disclosure by referring to the following detailed description in conjunction with the accompanying drawings. It should be noted that, for the sake of brevity of drawings and easy understanding by readers, each drawing in this disclosure only shows a part of the display panel, and some elements in each drawing are not drawn according to actual scale. In addition, the number and size of each element shown in the drawings are only for illustration, and are not used to limit the scope of this disclosure.

Certain words will be used throughout the specification and claims of this disclosure to refer to specific elements. It should be understood by those skilled in the art that electronic equipment manufacturers may refer to the same elements with different names. This article is not intended to distinguish those elements with the same function but different names. In the following description and claims, the words "comprising", "including" and "having" are open words, so they should be interpreted as "comprising but not limited to . . . ".

The "electrical connected" mentioned in this disclosure may include that more than two elements are in physical direct contact with each other and are in mutual conduction; or two or more elements are not in direct contact with each other, but are connected to each other by other elements (such as wires, contact structures, etc.), which all satisfy the definition of electrical connection described in this disclosure.

It should be understood that when an element or film is said to be "on" or "connected" to another element or film, it can be directly on or connected to this other element or film, or there is an intervening element or film between them. On the contrary, when a component is said to be "directly" on or "directly connected" to another component or film, there is no intervening component or film between them.

Ordinal numbers, such as "first" and "second", used in the specification and the request are used to modify the elements of the request. They do not mean and represent that the request element has any previous ordinal numbers, nor do they represent the order of a request element and another request element, or the order of manufacturing methods. These ordinal numbers are only used to make a request element with a certain name clearly distinguished from another request element with the same name. The electronic device disclosed in the present disclosure can include, for example, a display device, an antenna device, a sensing device, a touch display, a curved display or a free shape display, and can also be a bendable or flexibly spliced electronic device, but is not limited thereto. Electronic devices may include, for example, light emitting diodes, liquid crystal, fluorescence, phosphorescence, quantum dot (QD), other suitable display media, or combinations of the foregoing, but are not limited thereto. The light-emitting diode (LED) may include, for example, an organic light-emitting diode (OLED), inorganic light-emitting diode, millimeter light-emitting diode (mini LED), micro LED or quantum dot (QDLED), or other suitable materials or any arrangement and combination of the above, but not limited thereto. The antenna device can be, for example, a liquid crystal antenna, but is not limited thereto. It should be noted that the electronic devices disclosed in this disclosure can be any combination of the above, but are not limited thereto. In addition, the appearance of the electronic device can be rectangular, circular, polygonal, with curved edges or other suitable shapes. An electronic device may have peripheral systems such as a driving system, a control system, a light source system, a shelf system, etc. to support a display device or an antenna device. The following takes the display panel as an example.

When a flexible display panel is attached to a target with a curved surface profile, the flexible display panel will bend along the surface profile of the target. However, when the target includes a surface region with a Gauss curvature other than 0, the surface region will bend in at least two different directions at the same time, so if the flexible display panel is attached to it, creases will easily occur, which will affect the display effect of the flexible display panel. The following paragraphs describe how to determine the Gauss curvature in a curved surface in this disclosure.

Please refer to FIG. 1, which shows a schematic diagram of a region where a curved surface has different Gauss curvatures in this disclosure. As shown in FIG. 1, a display panel 100 includes a substrate 102, which forms a curved surface including at least a first region R1. The Gauss curvature K1 of the first region R1 is not equal to 0, and in detail, the Gauss curvature K1 can be greater than 0 or less than 0. The Gauss curvature referred to in this disclosure can be a point at any position on a curved surface, and this point can extend along the curved surface with two principal curvatures, and the Gauss curvature is the product of these two principal curvatures. More specifically, a point on a surface can extend an infinite number of curves along all directions of the surface, and each curve has its own curvature. The principal curvature here is defined as the curvature of a curve which has a maximum curvature, and the curvature which is perpendicular to the maximum (max) curvature is the minimum (min) curvature among these infinite curvatures, the maximum curvature and the minimum curvature are the two principal curvatures of this point.

In addition, the curved surface may include a second region R2, wherein the Gauss curvature K2 of the second region R2 may be different from the Gauss curvature K1 of the first region R1. In some embodiments of the present disclosure, the Gauss curvature K2 of the second region R2 may or may not be equal to 0.

According to a method for judging Gauss curvature in this disclosure, a scanning equipment and 3D analysis software (such as, but not limited to, Design X 3D) can be used to scan and model the target surface, and the Gauss curvature value can be obtained.

Figure 2A:
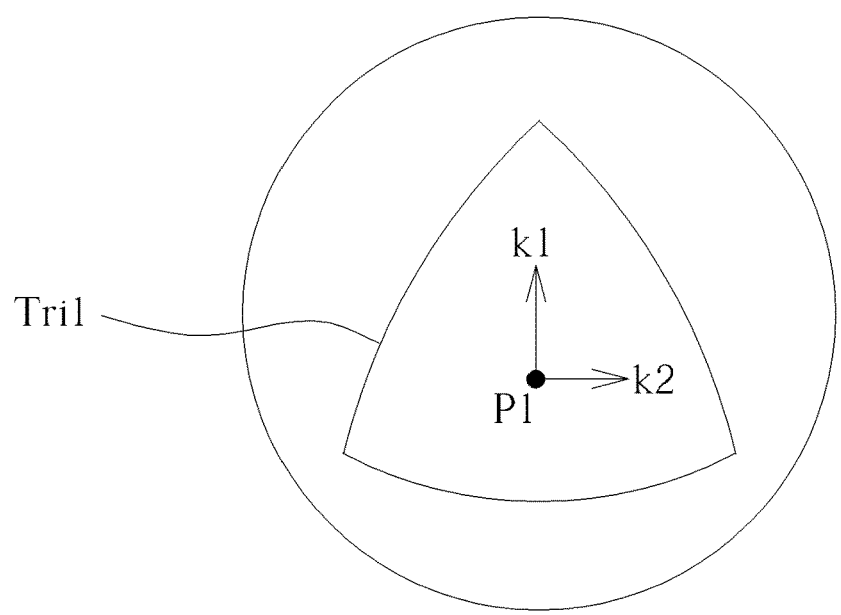
FIG. 2A shows a curved surface with positive Gauss curvature.
Figure 2B:
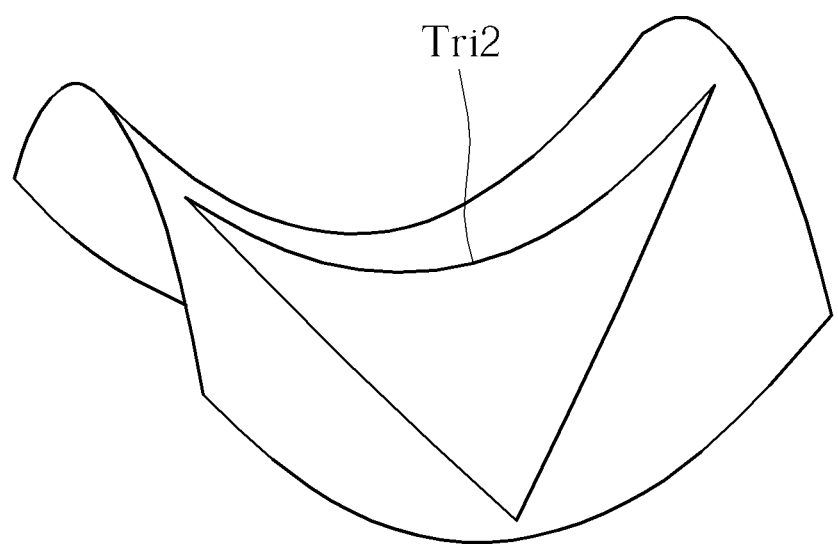
FIG. 2B shows a curved surface with negative Gauss curvature.
Figure 2C:
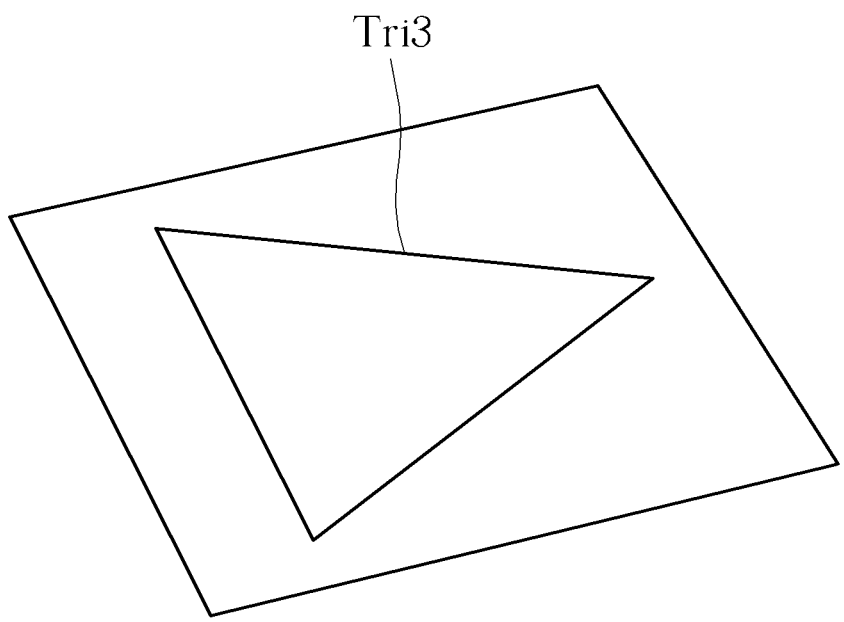
FIG. 2C shows a schematic plan view with Gauss curvature of 0.

This disclosure provides several other methods to determine Gauss curvature. Please refer to FIG. 2A, FIG. 2B and FIG. 2C. FIG. 2A shows a curved surface with positive Gauss curvature. FIG. 2B shows a curved surface with negative Gauss curvature; FIG. 2C shows a plane diagram with Gauss curvature of 0. As shown in FIG. 2A and FIG. 2B, a curved surface with a positive Gauss curvature may be similar to a sphere or a protruding shape, while a curved surface with a negative Gauss curvature may be similar to a saddle shape. In this disclosure, there are several methods to determine whether Gauss curvature is positive, negative or 0. The first method is to randomly connect three non-collinear points on a curved surface into a triangle, and then determine whether the inner angle sum of the triangle is greater than 180 degrees, equal to 180 degrees or less than 180 degrees. As shown in FIG. 2A, when the Gauss curvature of a curved surface is a positive number, three points are randomly connected on the curved surface to form a triangle Tri1, wherein the sum of the internal angles of the triangle Tri1 will be greater than 180 degrees. As shown in FIG. 2B, when the Gauss curvature of a curved surface is negative, three points are randomly connected on the curved surface to form a triangle Tri2, wherein the sum of the internal angles of the triangle Tri2 will be less than 180 degrees. As shown in FIG. 2C, when the Gauss curvature of the curved surface is 0, three points are randomly connected on the curved surface to form a triangle Tri3, the sum of the inner angles of the triangle Tri3 will be equal to 180 degrees. It is worth noting that within the error range of the inner angle of triangle Tri3 equal to 180 degrees plus or minus 5 degrees, the Gauss curvature can be zero.

Another method for judging Gauss curvature in this disclosure can take any point P1 on the curved surface, where the point P1 has two mutually perpendicular direction vectors, and their respective curvatures are curvature k1 and curvature k2, where the Gauss curvature of the curved surface is the product of curvature k1 and curvature k2 of the direction vector. Taking FIG. 2A as an example, the curvature k1 and k2 of the direction vector are both positive numbers, so the product of the curvatures of the two direction vectors is also positive. The method of judging the Gauss curvature of the curved surfaces in FIG. 2B and FIG. 2C is the same as above, so it is not repeated here.

After judging the Gauss curvature of the curved surface of the target, some regions with Gauss curvature not equal to zero are bent in at least two different directions at the same time. If the flexible display panel is directly attached to the curved surface, creases may easily occur. Therefore, in order to reduce the occurrence of creases in the flexible display panel, the present disclosure will form some openings on the substrates of the flexible display panel corresponding to regions where the Gauss curvature is not equal to zero. After the openings are formed on the substrate, the regions of the flexible display panel will be more flexible and less prone to crease, so it can be better attached to curved surfaces (especially on the curved surfaces with Gauss curvature not equal to zero).

Figure 3:
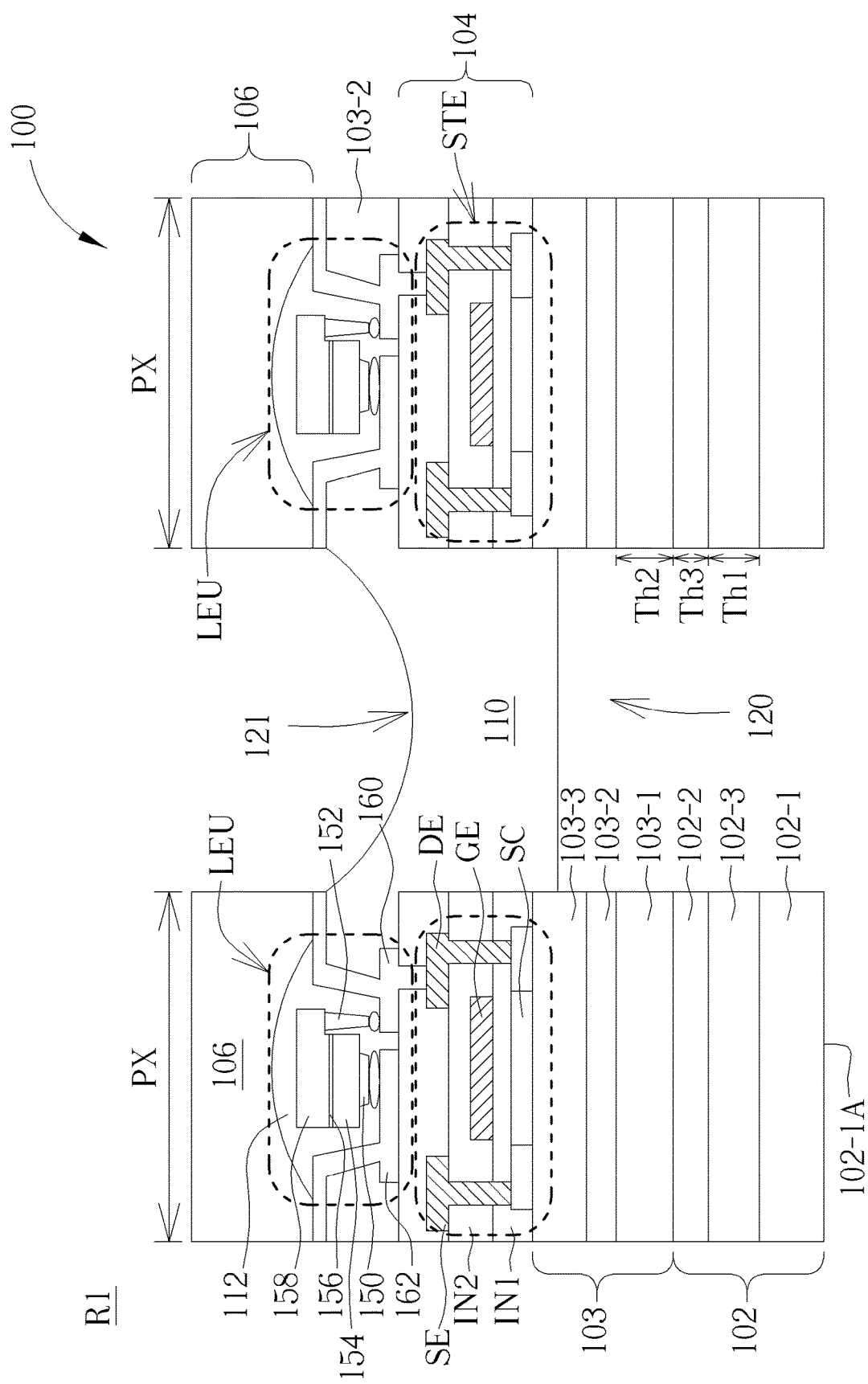
FIG. 3 is a partial sectional view of the display panel in the first region of FIG. 1.

Please refer to FIG. 3, which is a partial sectional view of the display panel in the first region R1 of FIG. 1. More specifically, FIG. 3 shows a schematic cross-sectional view after opening partial region of a display panel according to an embodiment of the present disclosure.

FIG. 3 shows that the display panel 100 has a plurality of pixel regions PX, for example, two adjacent pixel regions PX. The display panel 100 may include a substrate 102, a buffer layer 103, a circuit layer 104, and a functional layer 106. The circuit layer 104 may include a plurality of switching elements STE and the remaining insulating layers. The pixel region PX of the display panel 100 may include one or more light emitting units LEU and one or more switching elements STE (or driving elements) electrically connected with the light emitting units LEU. In which one or more light emitting units LEU and one or more switching elements STE are disposed on the substrate 102. To simplify the description, a light emitting unit LEU and a switching element STE for driving the light emitting unit LEU are drawn in a pixel region PX.

The substrate 102 is, for example, a flexible substrate. In an embodiment, the material of the substrate 102 may include a suitable transparent material or an opaque material. In some embodiments, the material of the substrate 102 is, for example, polycarbonate (PC), polyimide (PI), polypropylene (PP), polyethylene terephthalate (PET), other suitable materials or a combination of the above materials, but is not limited thereto. In addition, the light transmittance of the substrate 102 is not limited, that is, the substrate 102 can be a transparent substrate, a semi-transparent substrate or an opaque substrate. The substrate 102 referred to in this disclosure can be a substrate, on which a plurality of light emitting units LEU and a plurality of switching elements STE can be formed (but not limited to this). It is worth noting that a functional layer may be additionally disposed under the substrate 102, and the aforementioned functional layer may be a supporting film, for example.

In some embodiments of the present disclosure, the substrate 102 may include a multi-layer structure, for example, the substrate 102-1 and the substrate 102-2, and the oxide layer 102-3 sandwiched between the substrate 102-1 and the substrate 102-2. In some embodiments, the substrate 102-1 and the substrate 102-2 may be flexible substrates, for example. The oxide layer 103 is, for example, a silicon oxide layer, which has the effect of blocking water and oxygen, and reduces the influence of water and oxygen from entering the interior of the display panel 100 from the back surface (lower part in FIG. 3) of the display panel 100. However, in other embodiments of the present disclosure, the substrate 102 may also have a single layer structure.

In some embodiments of the present disclosure, the display panel 100 may include a buffer layer 103 located between the substrate 102 and the circuit layer 104. The buffer layer 103 can be a single layer or a multi-layer structure. Taking this embodiment as an example, the buffer layer 103 includes an oxide layer 103-1, a dielectric layer 103-2 and a dielectric layer 103-3. The buffer layer 103 has the effect of blocking water and oxygen or increasing the adhesion of the switching element STE. In addition, in some embodiments of this disclosure, the thicknesses of the buffer layer 103 and the substrate 102 can be adjusted to achieve better water and oxygen barrier effect. For example, the thickness of the oxide layer 102-3 is defined as Th1, the thickness of the oxide layer 103-1 is defined as Th2, and the thickness of the substrate 102-2 is defined as Th3 (each thickness described here is the maximum thickness during measurement). In one embodiment of this disclosure, the condition of Th1>Th2 can be satisfied, and/or the condition of $0.1 \leq (Th1+Th2)/Th3 \leq 0.5$ can be satisfied. When the above conditions are satisfied, a better effect of blocking water and oxygen can be achieved, and the flexibility of the substrate will not be affected because the oxide layer is too thick.

When the switching element STE is a thin film transistor, it may include a gate GE, a source SE, a drain DE and a semiconductor layer SC, wherein the source SE and the drain DE are electrically connected to the semiconductor layer SC respectively, and an insulating layer IN1 may be disposed between the gate GE and the semiconductor layer SC. An insulating layer IN2 is located between the source SE and the drain DE and the gate GE, and the source SE can be electrically connected to the signal line, for example. The drain DE can be electrically connected to the corresponding light emitting unit LEU through a connection pad 160.

The material of the semiconductor layer SC in the thin film transistor includes amorphous silicon, low temperature poly-silicon (LTPS) or metal oxide, for example. Thin film transistors can be a top gate thin film transistors (TFT), a bottom gate TFT, a dual gate or a double gate TFT, or a combination of the above materials, and this disclosure is not limited thereto. In some embodiments, different thin film transistors may have different semiconductor materials as described above.

The light emitting unit LEU is driven by the switching element STE. The light emitting unit LEU may be an inorganic light emitting diode (LED), an organic light emitting diode (OLED) or any other suitable element. And the inorganic LED can be a mini LED or a micro LED. In detail, the inorganic light emitting diode (LED) can be a flip chip-type LED or a vertical-type LED. One light emitting unit LEU may include a first electrode 150, a second electrode 152, a first semiconductor layer 154, a light emitting layer 156 and a second semiconductor layer 158. The light emitting layer 156 may be, for example, but not limited to, a multiple quantum well (MQW) layer. The first electrode 150 may be electrically connected to the common electrode through the connection pad 162. In addition, in some embodiments of this disclosure, the position of the second electrode 152 can be downward (as shown in FIG. 3) or upward (on the second semiconductor layer 158), which is also within the scope of the present disclosure.

The circuit layer 104 may further include a pixel defining layer 110 disposed between adjacent light emitting units LEU and a protective layer 112 disposed on the light emitting units LEU. The pixel defining layer 110 may define a light emitting region or a sub-pixel region. The light emitting unit LEU is disposed in the region of each subpixel. The protective layer 112 may protect the light emitting unit LEU to reduce the influence of air or humidity, for example.

As shown in FIG. 3, the substrate 102 has at least one opening 120. According to some embodiments, between adjacent pixel regions PX and in regions that do not include circuits, switching elements STE or light-emitting units LEU, materials such as dielectric layers or insulating layers can be removed by photolithography etching or laser ablation from the top or bottom of the display panel 100, and openings 120 can be formed to open part of the substrate 102. It is worth noting that the "opening" mentioned in this disclosure can be defined as a completely penetrating opening. For example, the substrate 102 can be etched by photolithography or ablated by laser from the surface 102-1A of the substrate 102 to form an opening 120. Any layer on the substrate 102 may not be limited, that is, any layer on the substrate 102 may be penetrated to form an opening 120, or may not be penetrated to form a recess)121. For example, in FIG. 3, for example, the substrate 102 and the buffer layer 103 can be etched by photolithography or laser ablation to form an opening 120, but a part of the pixel defining layer 110 or other insulating layer does not completely penetrate through to form a recess 121. According to some embodiments, after forming completely penetrating openings in each layer between the pixel regions PX, an insulating layer or an elastic material layer (not shown) is formed again and placed on the light emitting unit LEU and partially filled in the openings 120.

The display panel 100 may further include a functional layer 106 on the light emitting unit LEU. The functional layer 106 may include a touch layer, a cover layer, an anti-reflection layer, a protective layer, an insulating layer, an elastic material layer, an adhesive material layer or a combination thereof. It is worth noting that the functional layer 106 can be formed before the opening is formed, and then the functional layer 106 is partially removed along with laser ablation and other steps. Or in other embodiments, the functional layer 106 can be formed after the laser ablation and other steps, and the functional layer 106 is disposed on the light emitting unit LEU or partially filled in the opening 120 or partially filled in the recess 121. The functional layer 106 also has the effect of strengthening the packaging of each display panel 100.

To simplify the explanation, if the cross-sectional structure of the display panel is described in the following paragraphs, it will be simply represented by pixel regions PX, light emitting units LEU, switching elements STE, substrate 102 and other elements, and the reference numbers of some elements may be omitted. Elements in which reference numerals are omitted can know their characteristics with reference to corresponding elements shown in FIG. 3. It can be understood that the structure of the display panels described in the subsequent embodiments can be adjusted according to the actual needs, for example, the light emitting unit is replaced by an organic light emitting diode (OLED), or the number of layers and thickness of the substrate 102 can be adjusted, which can fall within the scope of this disclosure.

Figure 4A:
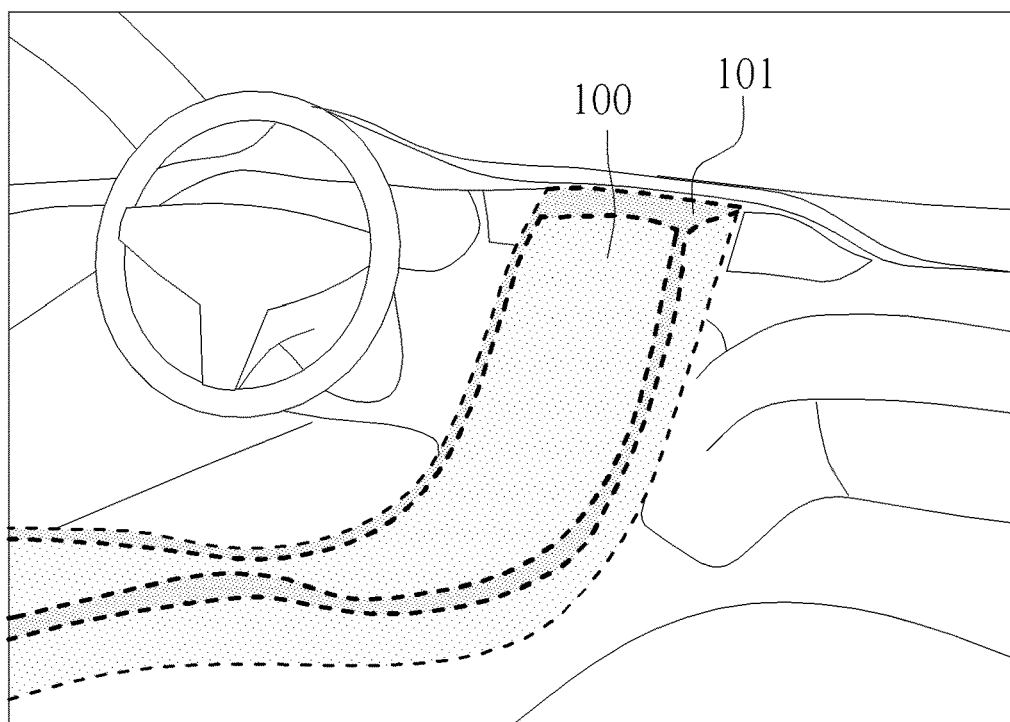
FIG. 4A and FIG. 4B illustrate the effect of attaching a display panel to a target according to an embodiment of the present disclosure.
Figure 4B:
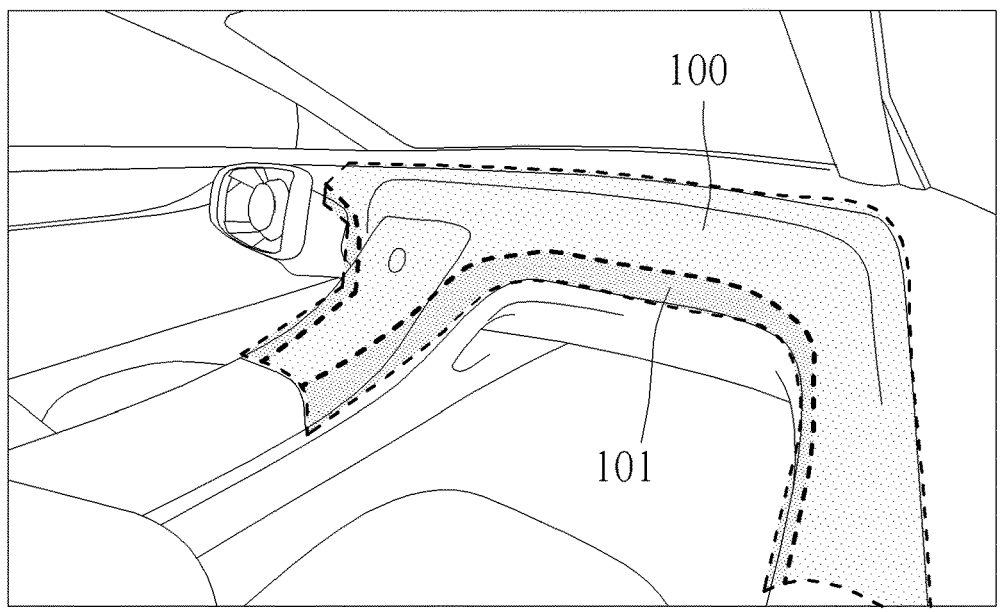

According to the present disclosure, after the substrate 102 of the display panel 100 is partially opened, the display panel 100 can be attached to a target containing a curved surface with a Gauss curvature other than zero, so as to achieve a better attachment effect. FIG. 4A and FIG. 4B illustrate the effect of attaching the display panel 100 to a target according to an embodiment of the present disclosure.

As shown in FIG. 4A and FIG. 4B, the display panel 100 can be attached to the center console of the vehicle or the region in front of the driver's seat. The display panel 100 also shows an opening region 101, which corresponds to the part of the target (such as the center console in the vehicle) where the Gauss curvature is not equal to zero, so as to match the bending of the structure in the vehicle and achieve the curved surface display effect. The aforementioned opening region 101 may include a substrate 102 with an opening, but layers other than the substrate 102 are not limited, that is, layers other than the substrate 102 may have no openings, openings, with recesses, or without recesses, and this disclosure is not limited thereto.

Figure 5:
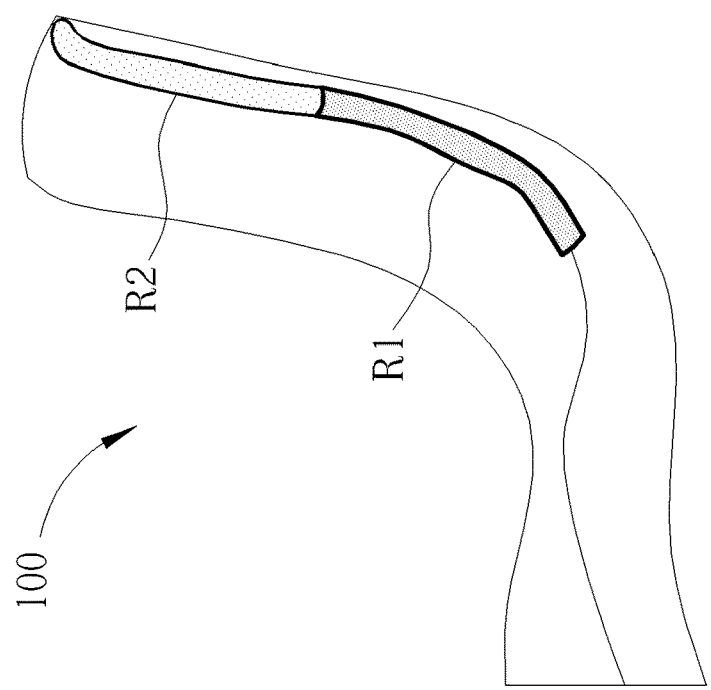
FIG. 5 is a schematic diagram of a display panel according to an embodiment of the present disclosure.

FIG. 5 is a schematic diagram of a display panel according to an embodiment of the present disclosure. The display panel 100 of FIG. 5 is attached to a target (not shown), so the display panel 100 presents a curved shape. As shown in FIG. 5, the display panel 100 has a first region R1 and a second region R2. In some embodiments, the first region R1 and the second region R2 are curved surfaces, in which the absolute values of Gauss curvatures are not equal to each other. For example, the first region R1 has a Gauss curvature K1, while the second region R2 has a Gauss curvature K2. In some embodiments, $|K1|>|K2|$. It is worth noting that the Gauss curvature of the first region R1 and the second region R2 is only an example of this disclosure, and this disclosure is not limited to this. In this embodiment, for example, the Gauss curvature K1 of the first region R1 is not equal to 0, and the Gauss curvature K2 of the second region R2 is not equal to 0. Therefore, both the first region R1 and the second region R2 are curved surfaces, and need to form openings in their respective regions.

In this disclosure, the "opening ratio" is further defined, where the opening ratio is equal to the ratio of the total opening region to the total area in a specific area. For example, take an area within a specific range, such as 0.2 mm*0.2 mm, and calculate the total area of all openings within this range, and divide this value by the total area to obtain the opening ratio of this area (region). It should be noted that the above-mentioned specific range area is also applicable to any other area, such as (but not limited to) 1.5 mm*1.5 mm or 0.1 mm*0.1 mm.

Figure 6:
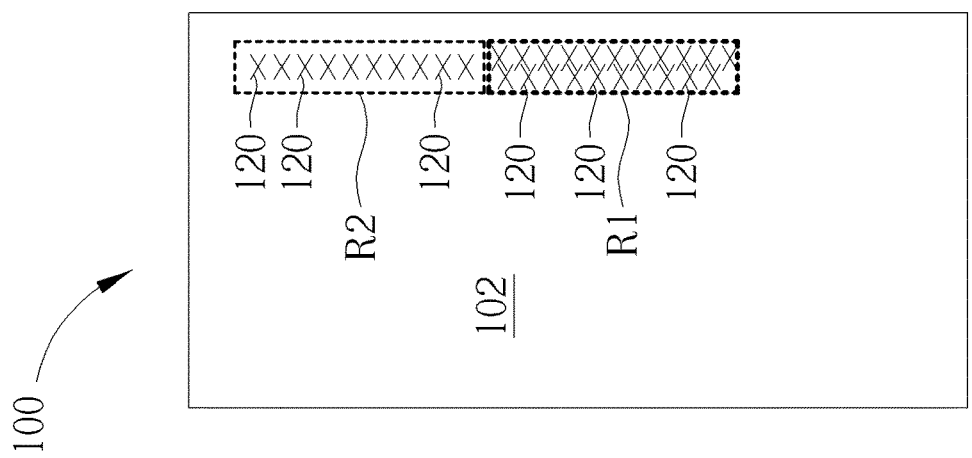
FIG. 6 is a schematic plan view of a display panel according to an embodiment of the present disclosure.

The opening ratio of a region will affect the flexibility of the region. In this disclosure, different regions with different Gauss curvatures can be formed with different opening ratios to achieve better attachment effect. For example, FIG. 6 shows a schematic plan view of the display panel 100 according to an embodiment of the present disclosure. In FIG. 6, the absolute values of Gauss curvatures of the first region R1 and the second region R2 are not equal to each other, and the opening ratio of the first region R1 may be different from that of the second region R2. Taking this embodiment as an example, the substrate 102 includes a plurality of openings 120 of the same size in the first region R1 and the second region R2, for example, a plurality of openings 120 with substantially same size. However, in the same unit area, the number of the openings 120 of the substrate 102 in the first region R1 is larger than that in the second region R2, resulting in the opening ratio of the first region R1 being larger than that of the second region R2. In this way, the first region R1 and the second region R2 can correspond to curved surfaces with different Gauss curvatures, for example, the first region R1 can correspond to curved surfaces with larger absolute value of Gauss curvatures, that is, $|K1|>|K2|$, so as to achieve better attachment effect. It is worth noting that the first region R1 and the second region R2 can be projected on the same plane, and the same area and shape can be taken, and then the opening ratio can be calculated and compared. For example, a range of, for example, 0.2 mm*0.2 mm can be framed separately from the first region R1 and the second region R2 under a microscope of the same magnification, and the shapes of these ranges are the same (for example, they are all quadrangles). In this range, the number of openings 120 of the substrate 102 in the first region R1 is larger than that in the second region R2, resulting in the opening ratio of the first region R1 being larger than that of the second region R2.

Figure 7:
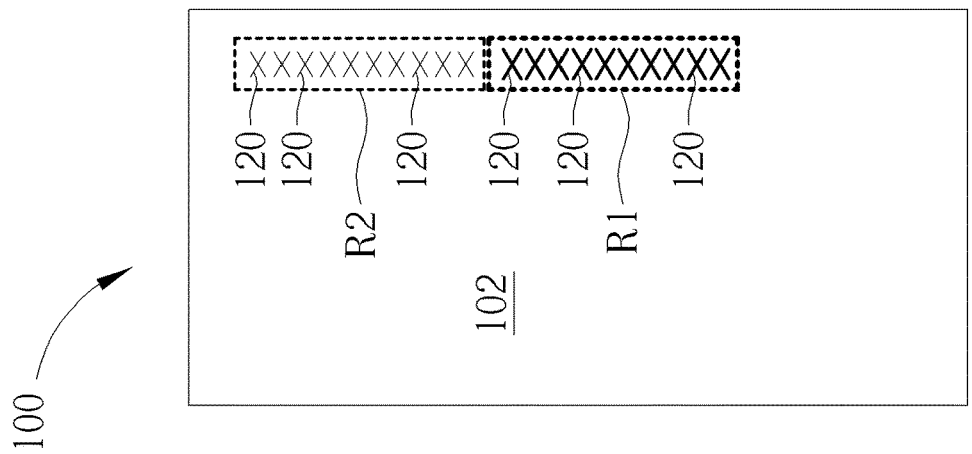
FIG. 7 is a schematic plan view of a display panel according to another embodiment of the present disclosure.

In another embodiment of the present disclosure, as shown in FIG. 7, FIG. 7 shows a schematic plan view of a display panel 100 according to another embodiment of the present disclosure. In FIG. 7, the absolute values of Gauss curvatures of the first region R1 and the second region R2 are not equal, and the opening ratio of the first region R1 may be different from that of the second region R2. In this embodiment, in the same unit area, the substrate 102 in the first region R1 and the substrate 102 in the second region R2 contain a plurality of openings 120 with the same number, but the total area of each opening 120 of the substrate 102 in the first region R1 is larger than that in the second region R2, resulting in the opening ratio of the first region R1 being larger than that of the second region R2. In this way, the first region R1 and the second region R2 can correspond to curved surfaces with different Gauss curvatures, for example, the first region R1 can correspond to curved surfaces with larger absolute value of Gauss curvatures, that is, |K1|>|K2|, so as to achieve better attachment effect. It is worth noting that the first region R1 and the second region R2 can be projected on the same plane, and the same area and shape can be taken, and then the opening ratio can be calculated and compared. For example, a range of, for example, 0.2 mm*0.2 mm can be framed separately from the first region R1 and the second region R2 under a microscope of the same magnification, and the shapes of these ranges are the same (for example, they are all quadrangles). In this range, the total area of the openings 120 of the substrate 102 in the first region R1 is larger than that in the second region R2, resulting in the opening ratio of the first region R1 being larger than that of the second region R2.

Except for the embodiments shown in FIG. 6 and FIG. 7, in which the opening ratio of a region is changed by changing the size or number of the openings of the substrate 102, in other embodiments of the present disclosure, the opening ratio of the region can be changed by changing the shape and arrangement of the openings of the substrate 102, etc., and all the above embodiments can fall within the scope of the present disclosure.

Figure 8A:
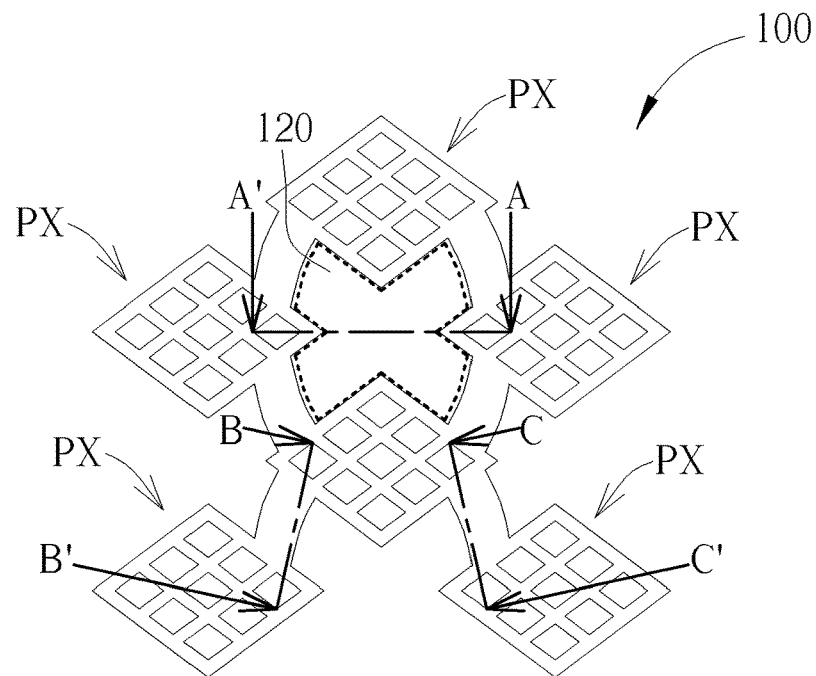
FIG. 8A is a partial top view of a display panel according to an embodiment of the present disclosure.
Figure 8B:
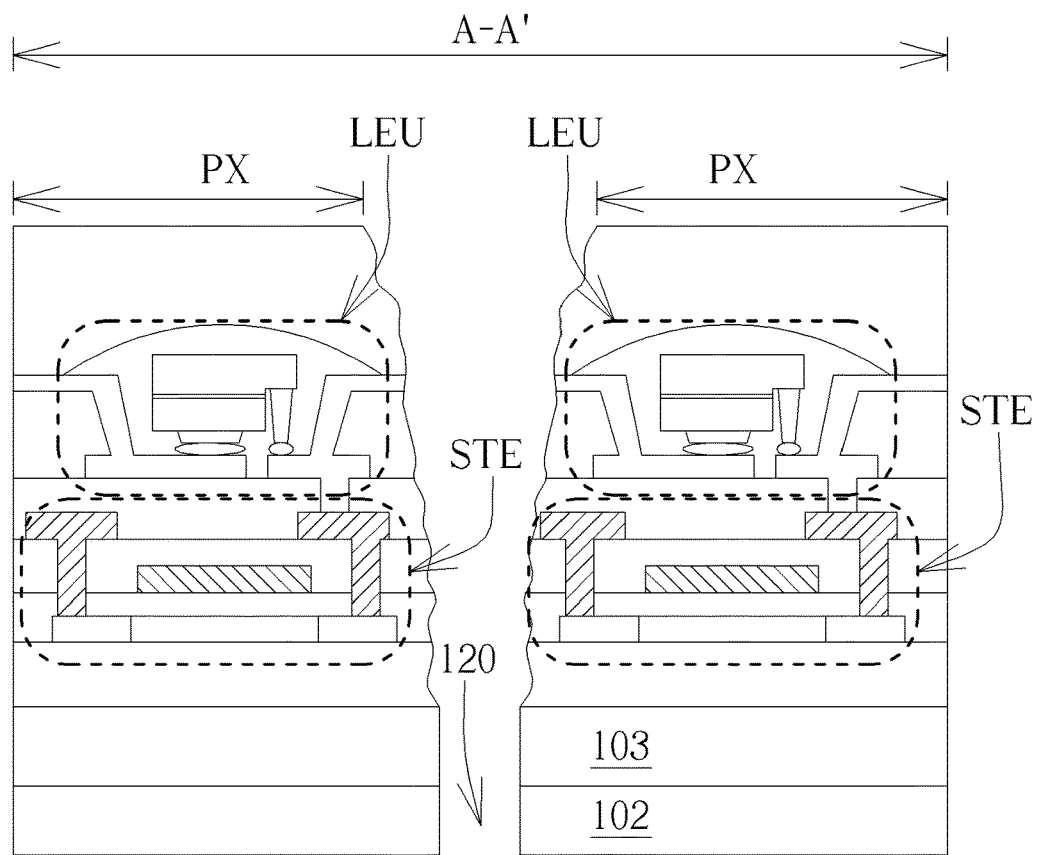
FIG. 8B shows a schematic cross-sectional view of the display panel taken along the cross-sectional line A-A' shown in FIG. 8A.

FIG. 8A shows a partial top view of a display panel according to an embodiment of the present disclosure, and FIG. 8B shows a cross-sectional view of the display panel taken along the cross-sectional line A-A' shown in FIG. 8A. As shown in FIG. 8A, the display panel 100 includes a plurality of pixel regions PX, each pixel region PX contains at least one light emitting unit LEU, a switching element STE or other elements (refer to FIG. 3), and an opening 120 may be included between two adjacent pixel regions PX. As shown in FIG. 8B, in this embodiment, the opening 120 of the substrate 102 may penetrate through the substrate 102, but is not limited thereto. In other embodiments of the present disclosure, other packaging materials or elastic materials can also be selectively filled in the opening 120.

Figure 9:
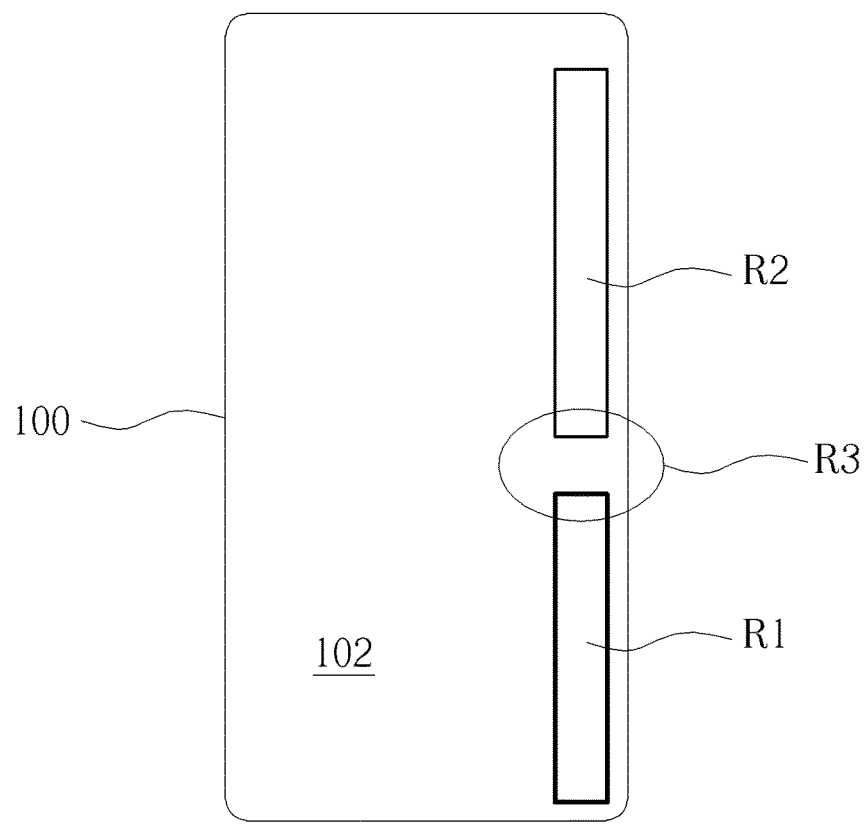
FIG. 9 is a partial top view of a display panel according to another embodiment of the present disclosure.
Figure 10:
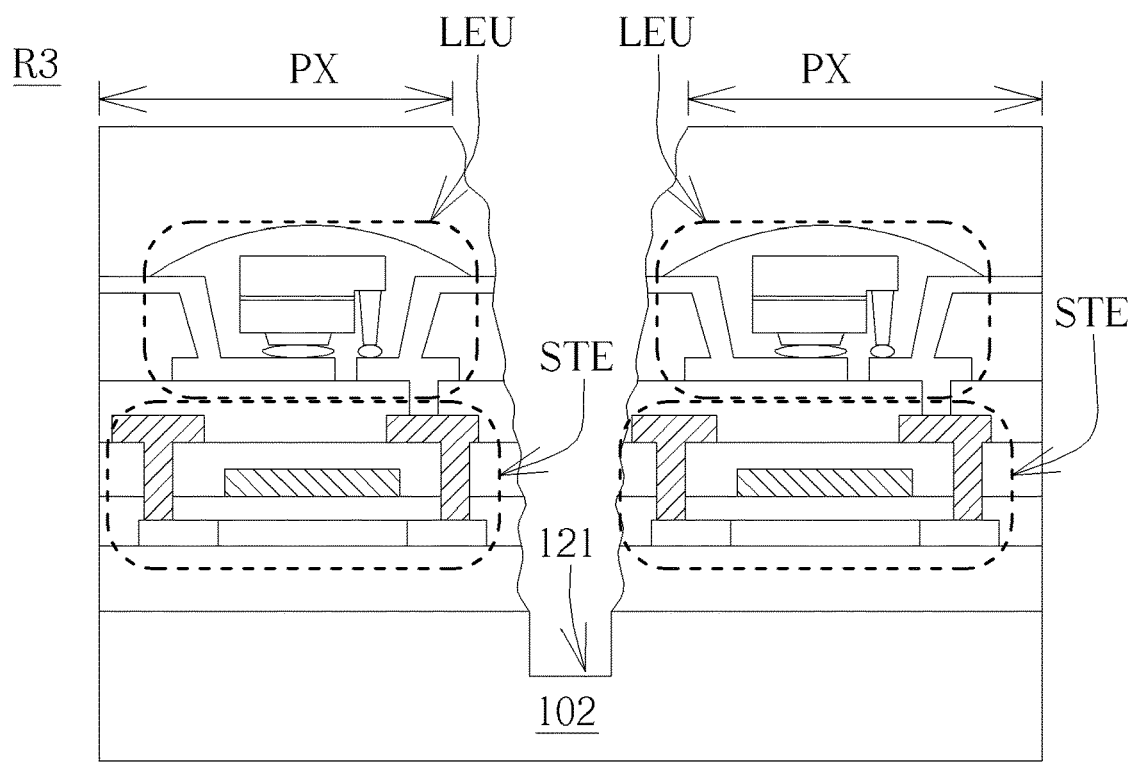
FIG. 10 is a schematic cross-sectional view of the display panel in the transition region of FIG. 9.

FIG. 9 shows a partial top view of the display panel according to another embodiment of the present disclosure, and FIG. 10 shows a cross-sectional view of the display panel in the transition region R3 of FIG. 9. As shown in FIG. 9, in some embodiments of the present disclosure, the Gauss curvature of the first region R1 is different from that of the second region R2, for example, the Gauss curvature K1 of the first region R1 is positive while the Gauss curvature K2 of the second region R2 is negative. In order to reduce the adverse effects caused by the rapid change of Gauss curvature, a transition region R3 can be defined between the first region R1 and the second region R2. As shown in FIG. 10, the substrate 102 in the transition region R3 may have a recess 121 (i.e., a recess that does not completely penetrate through the substrate 102) to reduce the influence caused by the rapid change of Gauss curvature in the first region R1 and the second region R2. This embodiment also falls within the scope of this disclosure.

In addition, in some embodiments of the present disclosure, the opened region (e.g., the first region R1) can selectively reduce the probability of being formed at the boundary of the substrate 102, that is, the periphery of the first region R1 can be surrounded by the substrate 102, thus achieving stronger structural strength. This embodiment also falls within the scope of this disclosure.

Figure 11:
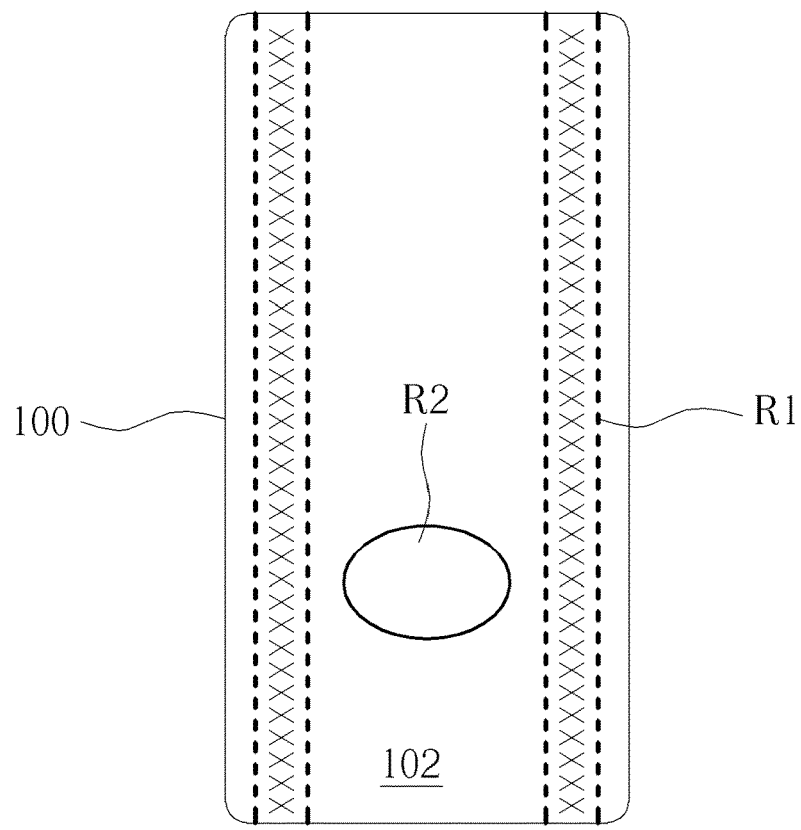
FIG. 11 is a partial top view of a display panel according to another embodiment of the present disclosure.
Figure 12:
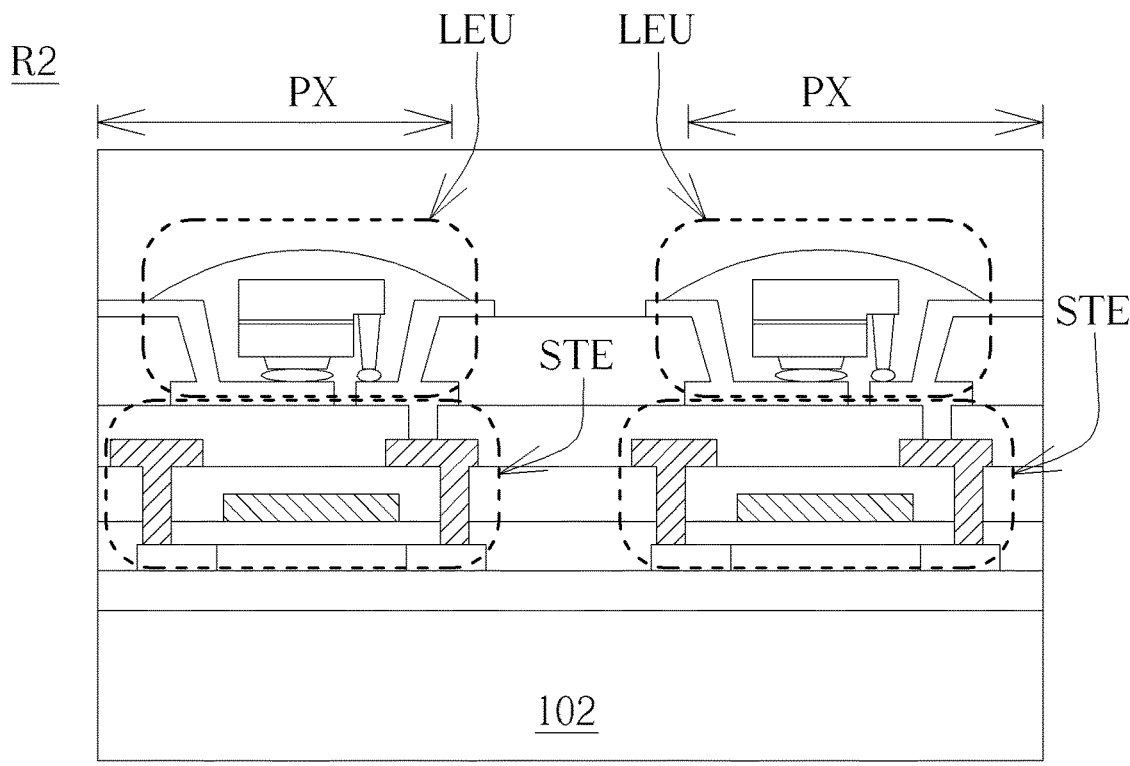
FIG. 12 is a schematic cross-sectional view of the display panel in the second region of FIG. 11.

FIG. 11 illustrates a partial top view of a display panel according to another embodiment of the present disclosure, and FIG. 12 illustrates a cross-sectional view of the display panel in the second region R2 of FIG. 11. In some embodiments of the present disclosure, the Gauss curvature K1 of the first region R1 is not equal to zero, while the second region R2 is, for example, a planar region or only a curved surface curved in one direction, so the Gauss curvature K2 of the second region R2 can be equal to zero, that is, in this embodiment, the first region R1 is a curved surface region and the second region R2 is a planar region or a curved surface region curved in one direction. As shown in FIG. 12, if the second region R2 is a planar region or a curved region bent in one direction, the substrate 102 may not have an opening 120 in the second region R2. In other words, if the second region R2 is a planar region or a curved region bent in one direction, the opening ratio of the second region R2 is zero, but the disclosure is not limited to this. In some embodiments, the substrate 102 corresponding to the second region R2 may also have an opening 120.

Figure 13A:
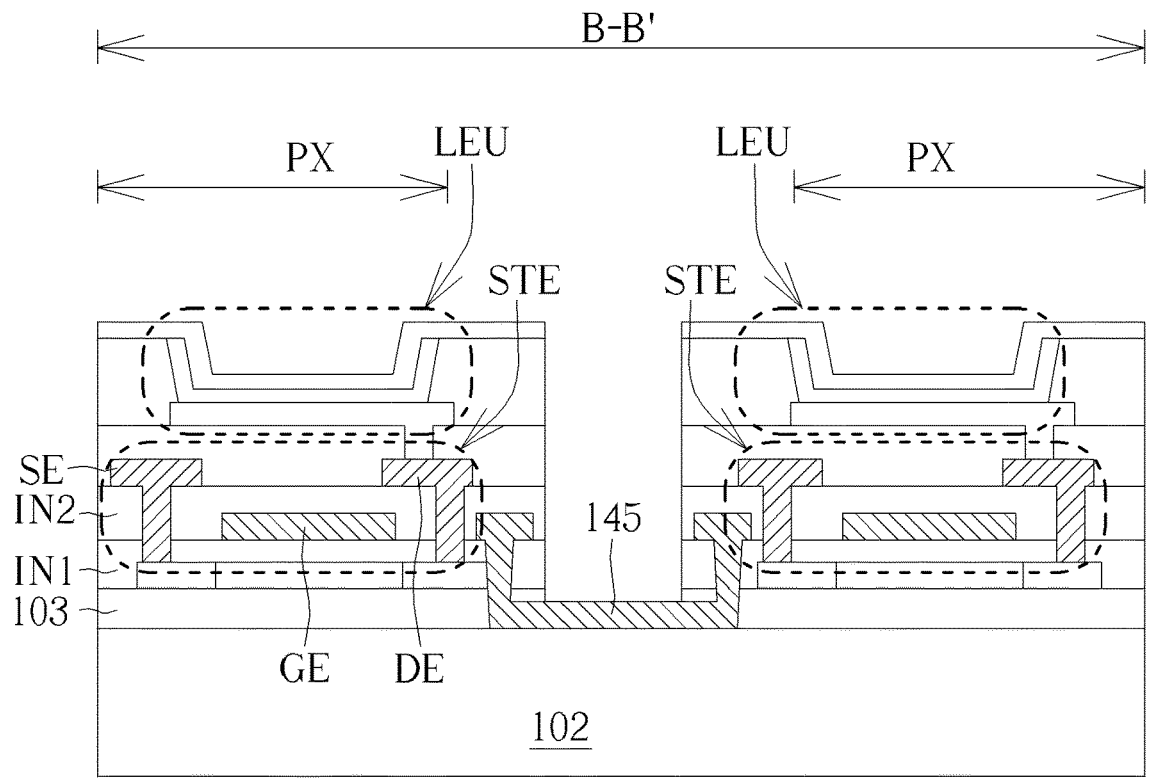
FIG. 13A shows a schematic sectional view of the display panel taken along the cross-sectional line B-B' in FIG. 8A.
Figure 13B:
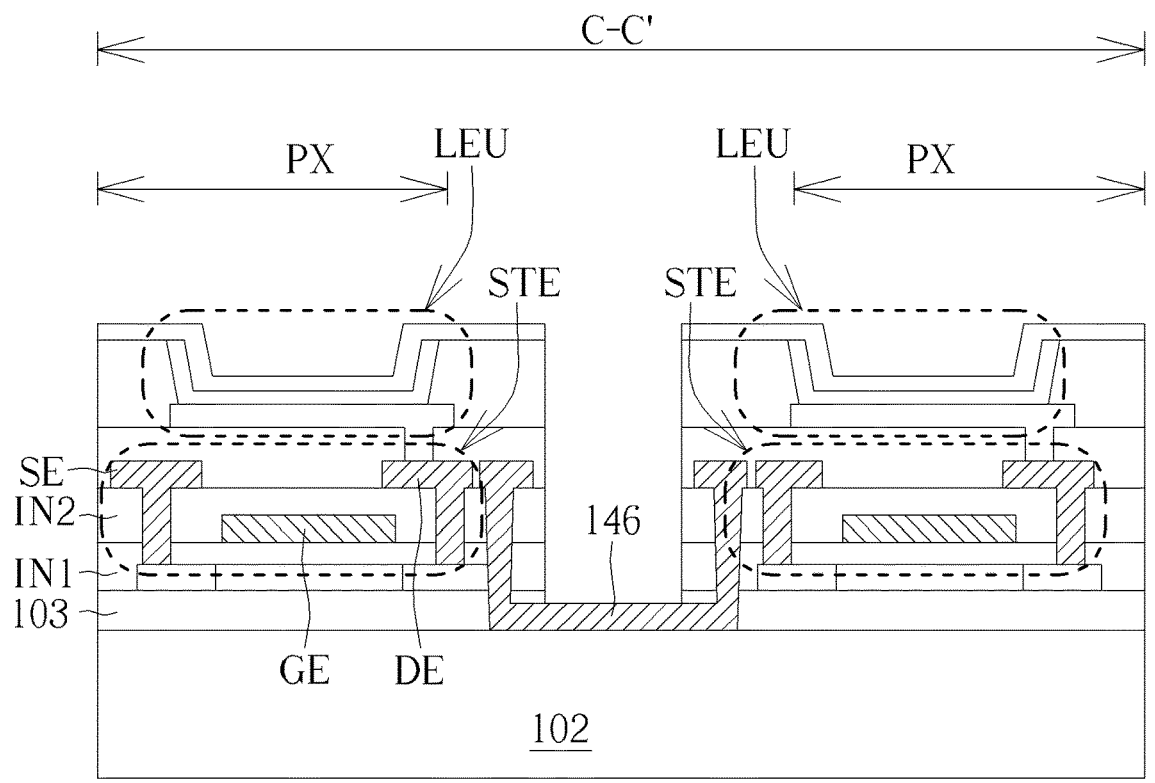
FIG. 13B shows a schematic cross-sectional view of the display panel taken along the cross-sectional line C-C' in FIG. 8A.

It is worth noting that in this disclosure, except for the opening 120 formed between two adjacent pixel regions PX, circuit elements or wires connecting scan lines or data lines, can also be included to connect different pixel regions PX together. FIG. 13A shows a schematic cross-sectional view of the display panel taken along the cross-sectional line B-B' in FIG. 8A, and FIG. 13B shows a schematic cross-sectional view of the display panel taken along the cross-sectional line C-C' in FIG. 8A. As shown in FIG. 13A, a circuit element 145 is included between two adjacent pixel regions PX, and a part of the circuit element 145 is located on the substrate 102, the circuit element 145 penetrates through the insulating layer IN2, the insulating layer IN1 and the buffer layer 103 in the adjacent pixel regions PX and is partially exposed in the opening 120. The circuit element 145 can be electrically connected directly or indirectly to the switching element STE in the adjacent pixel regions PX, such as (but not limited to) the gate GE of the switching element STE, to provide a signal. In some embodiments, the circuit element 145 can be electrically connected directly or indirectly to the source SE of the switching element STE to provide a display signal.

In addition, in this embodiment, the light emitting unit LEU uses an organic light emitting diode (OLED) instead of the inorganic light emitting diode used in other embodiments. In this embodiment, a single-layer substrate 102 and a single-layer buffer layer 103 are used. This structure also falls within the scope of this disclosure.

In another embodiment of the present disclosure, as shown in FIG. 13B, a circuit element 146 is included between two adjacent pixel regions PX, and a part of the circuit element 146 is located on the substrate 102, the circuit element 146 penetrates through the insulating layer IN2, the insulating layer IN1 and the buffer layer 103 in the adjacent pixel regions PX and is partially exposed in the opening 120. The circuit element 146 can be electrically connected directly or indirectly to the switching element STE in the adjacent pixel regions PX, such as (but not limited to) the source SE or the drain DE of the switching element STE to provide a signal. In some embodiments, the circuit element 146 can be electrically connected directly or indirectly to the gate GE of the switching element STE to provide a display signal.

Figure 14:
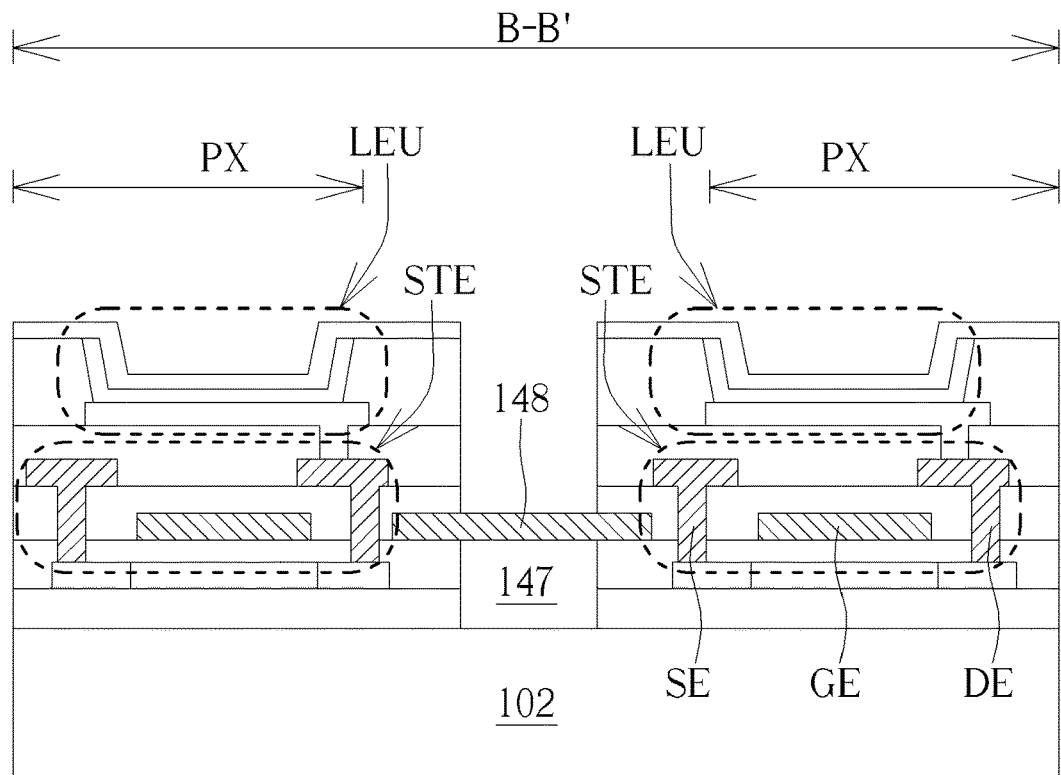
FIG. 14 is a schematic cross-sectional view of a display panel according to another embodiment of the present disclosure.

In other embodiments of the present disclosure, the circuit elements connecting the two pixel regions PX may have other different structures. For example, FIG. 14 shows a schematic cross-sectional view of a display panel according to another embodiment of the present disclosure. As shown in FIG. 14, in this embodiment, a planarization layer 147 is formed on the substrate 102 exposed between the two pixel regions PX, and then a circuit element 148 is formed on the planarization layer 147, and the circuit element 148 can be connected to the gate GE or the source SE/the drain DE of the switching element STE adjacent to the pixel regions PX on both sides (in FIG. 14, connecting the gates GE on both sides is taken as an example). In this embodiment, because the circuit element 148 is formed on the planarization layer 147, the circuit element 148 has more flat or stable cross-sectional structure, which increases the stability of the display panel 100. In this embodiment, the planarization layer 147 is, for example, an organic material layer, but is not limited thereto.

Figure 15:
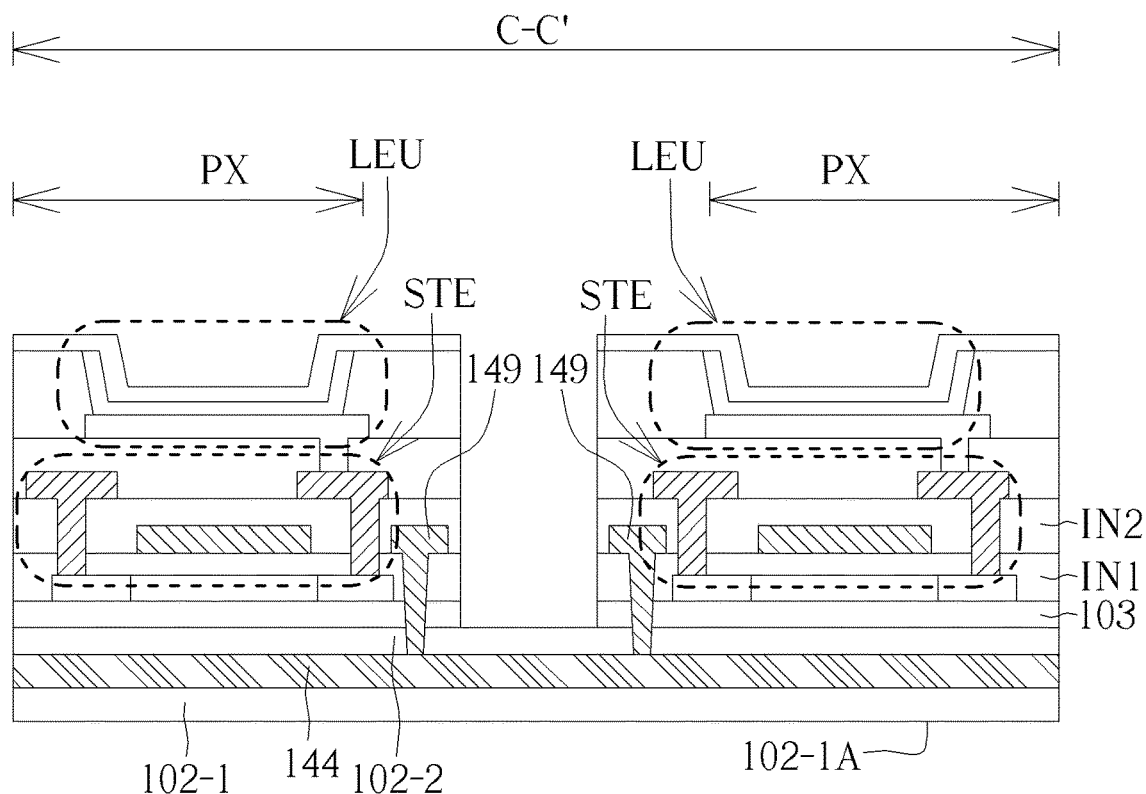
FIG. 15 is a schematic cross-sectional view of a display panel according to another embodiment of the present disclosure.

In other embodiments of the present disclosure, please refer to FIG. 15, which shows a schematic cross-sectional view of a display panel according to another embodiment of the present disclosure. As shown in FIG. 15, the substrate in this embodiment includes an upper substrate 102-1 and a lower substrate 102-2, and a conductive layer 144 sandwiched between the upper substrate 102-1 and the lower substrate 102-2. In addition, the circuit elements 149 connecting the switching elements STE in the adjacent pixel regions PX on both sides are respectively connected to the conductive layer 144 after passing through the insulating layer IN2, the insulating layer IN1, the buffer layer 103 and the substrate 102-2, and the gates GE or the sources SE/drains DE of the switching elements STE on both sides are connected to each other (in FIG. 15, connecting the gates GE on both sides is taken as an example). In the structure of this embodiment, the conductive layer 144 is embedded between the two substrates 102-1 and 102-2, which can isolate water and oxygen, or other circuit components (such as IC) can be formed on the back of the display panel 100 (that is, the surface 102-1A of the substrate 102-1), and the conductive layer 144 is used as a connecting line, thus achieving the effect of saving process steps.

Figure 16:
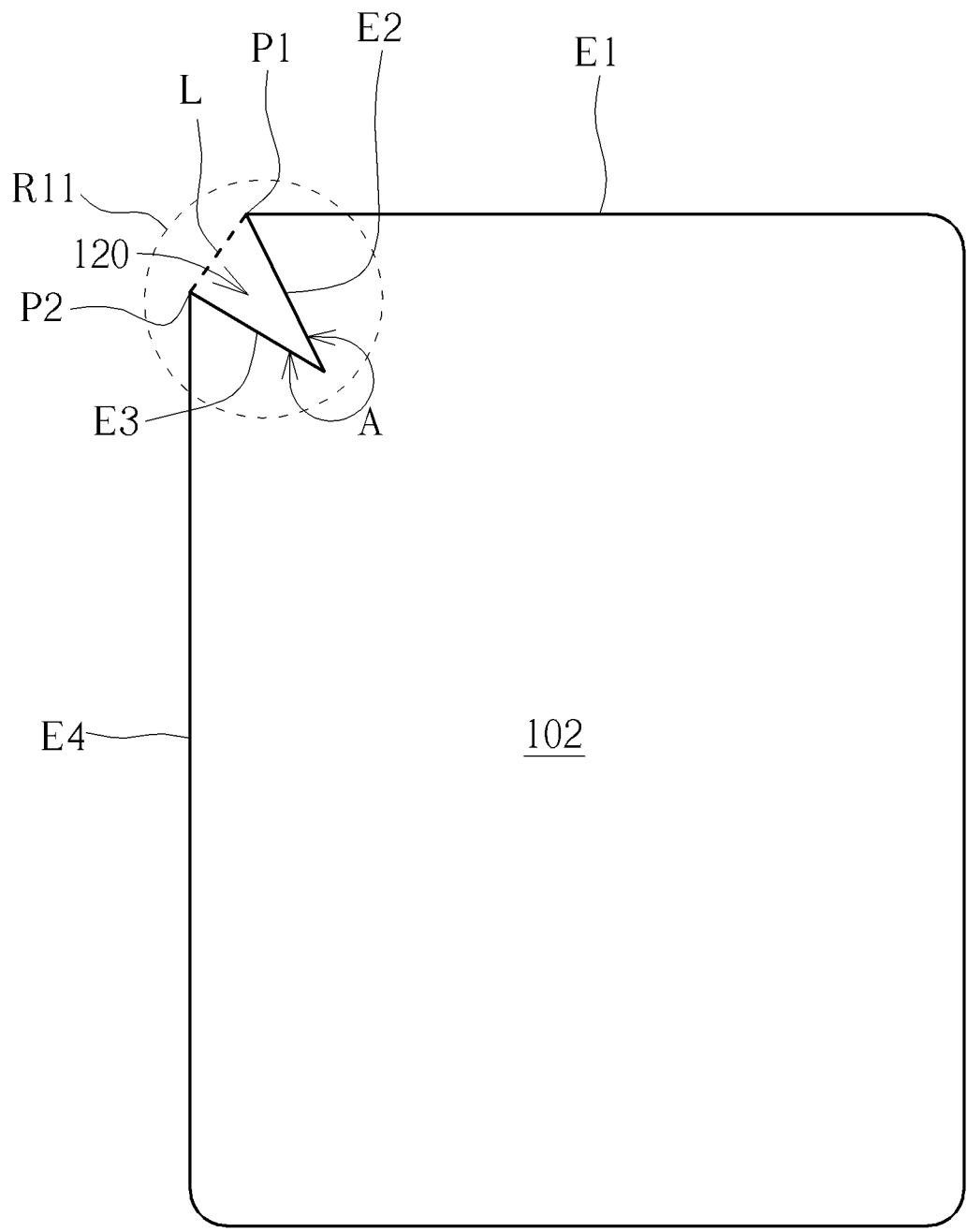
FIG. 16 is a schematic plan view of a display panel according to an embodiment of the present disclosure.

In the above embodiments, such as the embodiment shown in FIG. 6 or FIG. 7, the opening is located inside the substrate, that is, the opening is surrounded by the substrate. However, in other embodiments of the present disclosure, the opening may be located at the edge of the substrate, so the opening may overlap with the boundary (edge) of the substrate. As shown in FIG. 16, FIG. 16 is a schematic plan view of a display panel according to an embodiment of the present disclosure. In this embodiment, the substrate 102 includes a first region R11, the first region R11 is located at a corner of the substrate 102, and the Gaussian curvature K1 of the first region R11 is not zero. In addition, the first region R11 contains an opening 120, so the opening 120 is located at the edge of the substrate 102. In other words, the opening 120 is adjacent to one edge of the substrate 102. More specifically, the substrate 120 has a first edge E1, a second edge E2, a third edge E3 and a fourth edge E4, and the second edge E2 and the third edge E3 are adjacent to the first opening 120. The second edge E2 is connected to the first edge E1, and the third edge E3 is connected to the fourth edge E4. It is noted that the shape of the opening 120 is not limited to that in this embodiment, but its shape of the openings can be adjusted according to requirements. When the opening is polygonal, the substrate 102 may also contain more than two edges adjacent to the opening 120. At least two edges of the substrate 120 adjacent to the opening 120 connect two different edges of the substrate 102 respectively (for example, in this embodiment, the second edge E2 is connected to the first edge E1, and the third edge E3 is connected to the fourth edge E4).

In addition, it is worth noting that the opening 120 in this embodiment is located at the corner (or boundary) of the substrate 102, so a "concave notch" is formed at the corner of the substrate 102. The opening (notch) defined by the present invention can selectively meet the following conditions: the interior angle A of two connected substrate edges adjacent to the opening 120 (for example, the second edge E2 and the third edge E3) is greater than 180 degrees, or two nonadjacent points can be found in the substrate 102, and a line segment connected by these two points is located outside the substrate 102. For example, the substrate 102 in FIG. 16 includes two nonadjacent points P1 and P2, and the connection L between the two points is located outside the range of the substrate 102 (does not overlap with the substrate 102).

Figure 17:
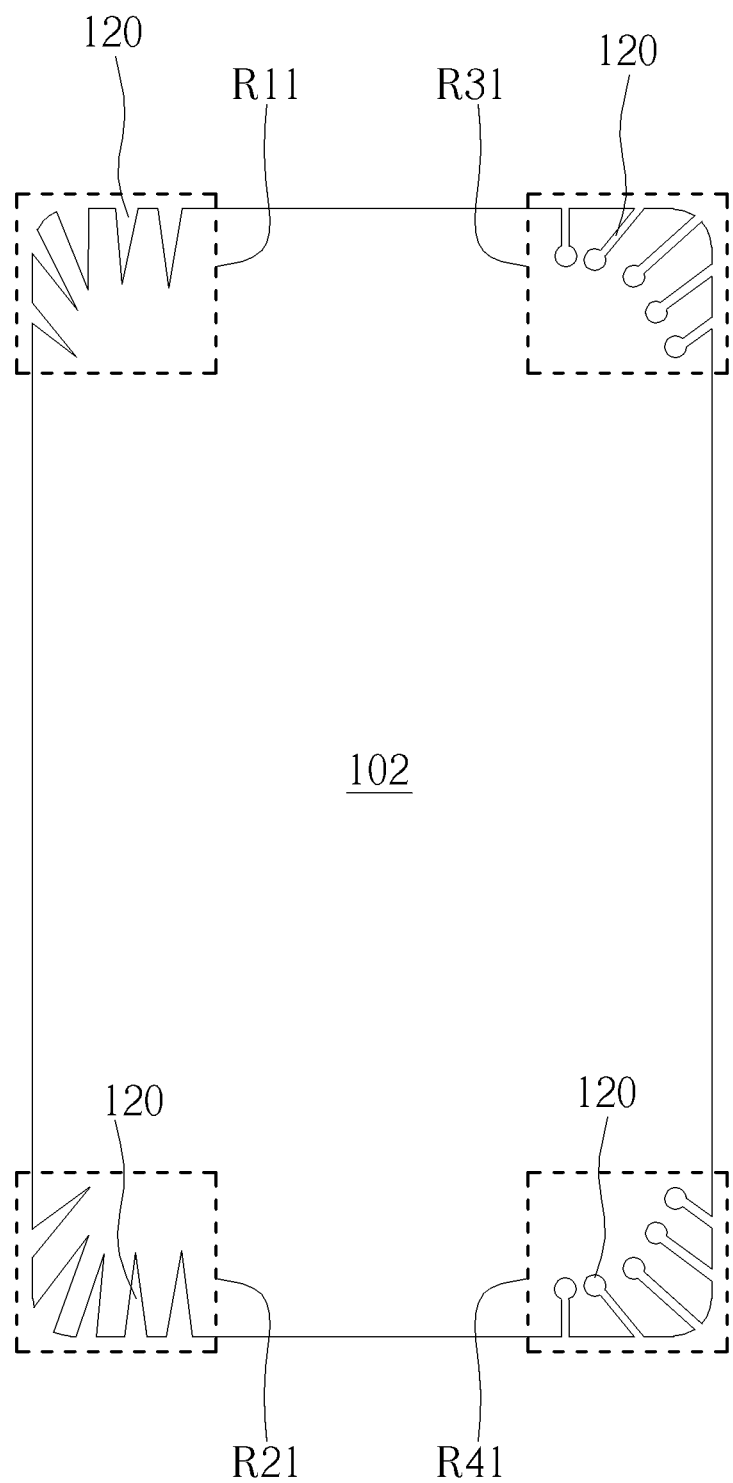
FIG. 17 is a schematic plan view of a display panel according to an embodiment of the present disclosure.

In other embodiments of the present disclosure, the substrate may include a plurality of regions with Gaussian curvature K other than zero, and each region includes openings with the same or different shapes. As shown in FIG. 17, FIG. 17 is a schematic plan view of a display panel according to an embodiment of the present disclosure. In this embodiment, the substrate 102 includes a plurality of regions, For example, a first region R11, a second region R21, a third region R31 and a fourth region R41, the first region R11 to the fourth region R41 are located at different corners of the substrate 102, and the Gaussian curvature K of the first region R11 to the fourth region R41 is not zero. Similarly, the first region R11 to the fourth region R41 each include an opening 120 located therein, where the opening 120 is similar to the opening 120 described in the above-mentioned FIG. 16, but the shape of the opening 120 can be adjusted, and the shapes of the openings 120 included in the first region R11 to the fourth region R41 can be the same as or different from each other. For example, the shape of the opening 120 in the first region R11 is the same as that in the second region R21, but the shape of the opening 120 in the first region R11 is different from that of the opening 120 in the third region R31. The arrangement or shape of the openings 120 can be adjusted according to actual requirements, and the present disclosure is not limited thereto.

Figure 18:
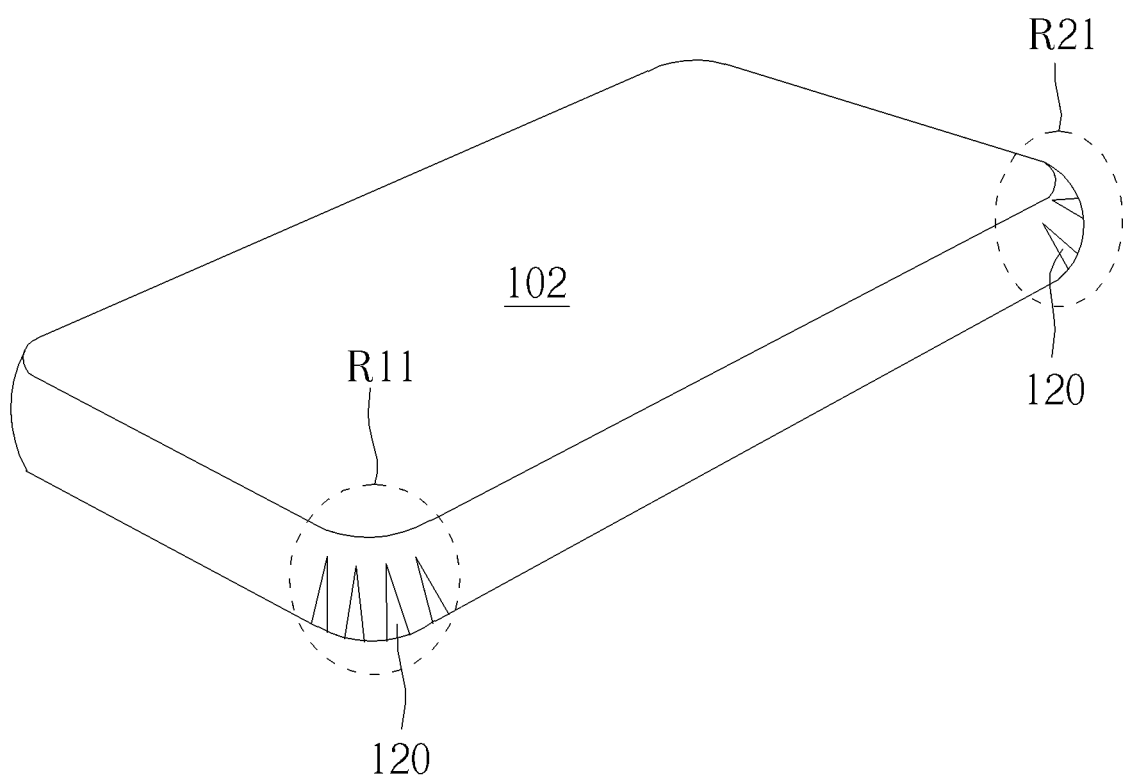
FIG. 18 shows a schematic diagram of attaching the display panel of the present disclosure to an electronic device.

As shown in FIG. 18, FIG. 18 shows a schematic diagram of attaching the display panel of the present disclosure to an electronic device. The display panel of the above embodiment (for example, the structure shown in FIG. 16 or FIG. 17) includes the opening at the corner, therefore, it can be applied to be attached to electronic devices (such as mobile phones or tablet devices). In particular, it is attached to the corner of the electronic device, so that the corner of the electronic device has the function of light emission or touch control, and at the same time, it is not easy to generate wrinkles at the corner.

Figure 19:
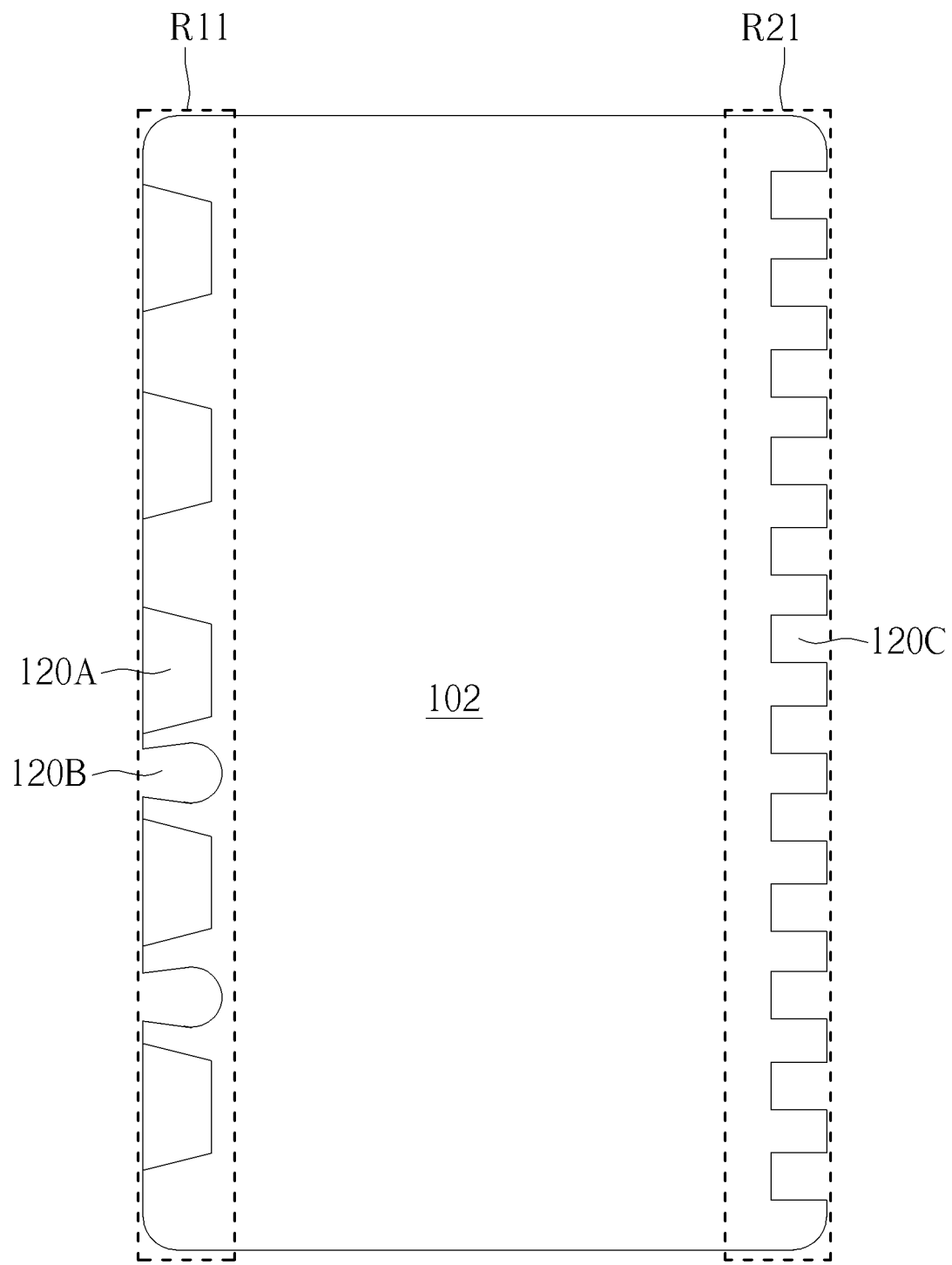
FIG. 19 is a schematic plan view of a display panel according to an embodiment of the present disclosure.
Figure 20:
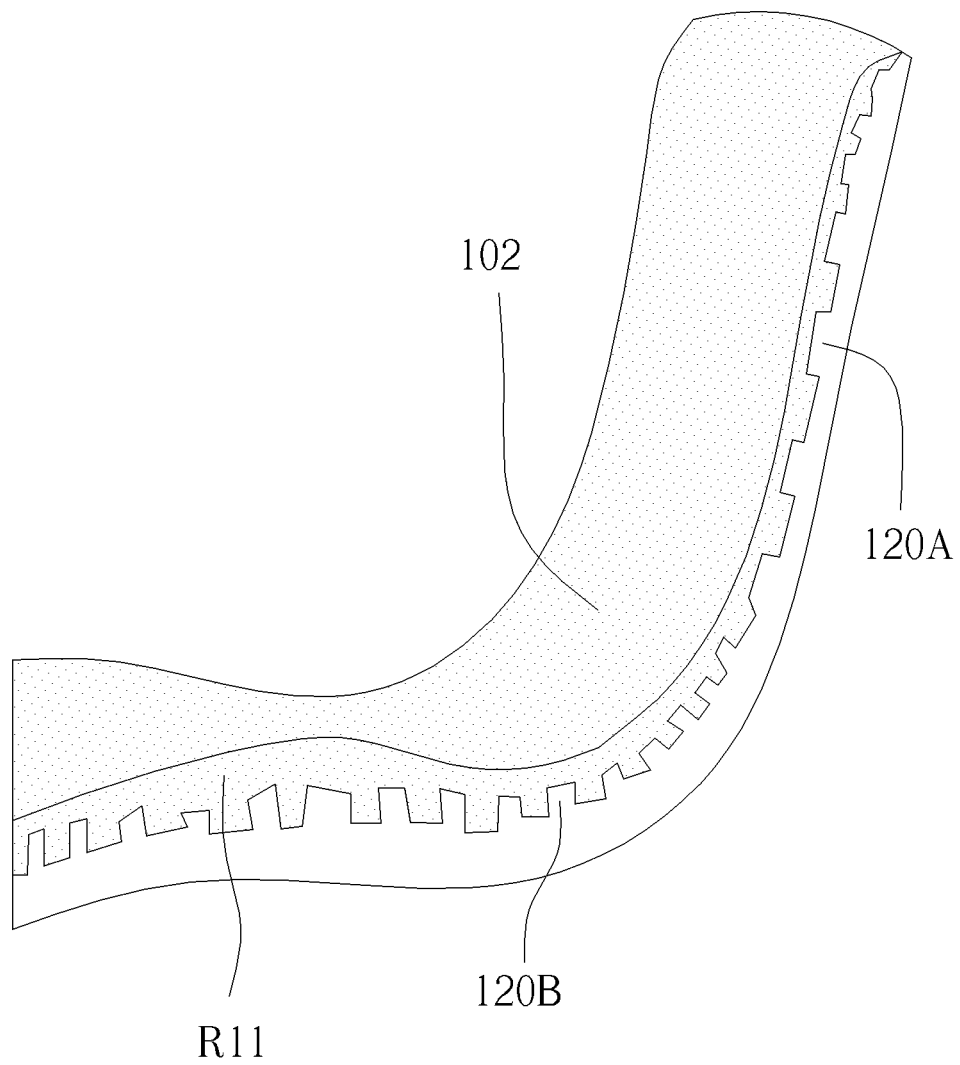
FIG. 20 illustrations of the effect of attaching a display panel to a target according to an embodiment of the present disclosure.

As shown in FIGS. 19-20, FIG. 19 is a schematic plan view of a display panel according to an embodiment of the present disclosure, and FIG. 20 illustrations of the effect of attaching a display panel to a target according to an embodiment of the present disclosure. In this embodiment, The substrate 102 includes a first region R11 and a second region R21, the Gaussian curvature K of the first region R11 and the second region R21 is not zero, and the first region R11 and the second region R21 contain a plurality of openings. Different from the above-mentioned embodiment (FIG. 16-FIG. 17), the first region R11 and the second region are located at the side of the substrate 102, not just at the corner of the substrate 102. Similarly, the openings 120 can also be distributed in different regions according to requirements. For example, in this embodiment, the first region R11 includes two different shapes of openings, namely, the openings 120A and the openings 120B, while the second region R21 includes another shape of the openings 120C. Because of the different shapes of openings, the area of the different openings may be different. For example, the openings 120A and the openings 120B or the openings 120C have different area. The display panel of this embodiment can be attached to a curved object (for example, shown in FIG. 20). In this embodiment, the arrangement and density of the openings 120A, 120B and 120C can be adjusted, so that the display panel can be better attached to the curved target. In addition, as shown in FIG. 20, except for the position of the opening, the remaining parts of the first region R11 and the second region R21 of the substrate 102 are also attached to the curved surface (the regions with non-zero Gaussian curvature), and these regions may contain light emitting elements or touch components, so that the curved surface of the target object has a luminous function or a touch function.

According to the above description and drawings (especially FIGS. 16-20), the present disclosure provides a display panel, comprising a flexible substrate 102 having a first edge E1 and a curve region R11, wherein the curve region has a Gauss curvature K1 not equal to zero, a plurality of thin film transistors disposed on the flexible substrate 102, and a plurality of light emitting units disposed on the flexible substrate 102 and driven by the thin film transistors, wherein the flexible substrate 102 has a first opening (120 or 120A) in the curve region and a second edge E2 adjacent to the first opening.

In some embodiment of the present disclosure, the first edge E1 is connected to the second edge E2.

In some embodiment of the present disclosure, the first opening 120 is located at a corner of the flexible substrate 102.

In some embodiment of the present disclosure, the flexible substrate further has a third edge E3 adjacent to the first opening, the second edge E2 is connected to the third edge E3 and an interior angle A of the second edge E2 and the third edge E3 is greater than 180 degrees.

In some embodiment of the present disclosure, the flexible substrate 102 further has a second opening 120B adjacent to an edge of the flexible substrate, an area of the first opening 120A is different from an area of the second opening 120B.

In some embodiment of the present disclosure, the flexible substrate further has a second opening 120B adjacent to an edge of the flexible substrate, a shape of the first opening 120A is different from a shape of the second opening 120B.

To sum up, the present disclosure provides a display panel which can be attached to a target. The display panel has a partial region corresponding to a curved surface with Gauss curvature not equal to zero, and openings are formed in the partial region of the display panel. After the openings are formed, it is helpful to improve the flexibility of the display panel. When the display panel is covered on a curved surface with Gauss curvature not equal to zero, creases are less likely to occur and the display effect of the display panel is improved.

It should be noted that, without departing from the spirit of this disclosure, the above disclosed features can be combined, modified, replaced or reused with one or more disclosed embodiments in any suitable way, and are not limited to specific embodiments.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display panel, comprising:
a flexible substrate having a first edge and a curve region, wherein the curve region has a Gauss curvature K1 not equal to zero;
a plurality of thin film transistors disposed on the flexible substrate; and
a plurality of light emitting units disposed on the flexible substrate and driven by the thin film transistors;
wherein the flexible substrate has a first opening in the curve region and a second edge adjacent to the first opening; and
wherein the flexible substrate further has a second opening adjacent to an edge of the flexible substrate, wherein a shape of the first opening is different from a shape of the second opening.

2. The display panel according to claim 1, wherein the flexible substrate comprises an another region having a Gauss curvature K2 satisfying a following relation:

$$|K1|>|K2|;$$

wherein the curve region has an opening ratio greater than an opening ratio of the another region.

3. The display panel according to claim 2, wherein the Gauss curvature K2 is not equal to zero.

4. The display panel according to claim 2, wherein the Gauss curvature K2 is equal to zero.

5. The display panel according to claim 4, wherein the opening ratio of the another region is zero.

6. The display panel according to claim 1, wherein the first edge is connected to the second edge.

7. The display panel according to claim 1, wherein the first opening is located at a corner of the flexible substrate.

8. The display panel according to claim 1, wherein the flexible substrate further has a third edge adjacent to the first opening, wherein the second edge is connected to the third edge and an interior angle of the second edge and the third edge is greater than 180 degrees.

9. The display panel according to claim 1, wherein the flexible substrate further has a second opening adjacent to an edge of the flexible substrate, wherein an area of the first opening is different from an area of the second opening.

* * * * *